US009129887B2

(12) United States Patent
Jo

(10) Patent No.: US 9,129,887 B2
(45) Date of Patent: Sep. 8, 2015

(54) RESISTOR STRUCTURE FOR A NON-VOLATILE MEMORY DEVICE AND METHOD

(71) Applicant: Crossbar, Inc., Santa Clara, CA (US)

(72) Inventor: Sung Hyun Jo, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/739,283

(22) Filed: Jan. 11, 2013

(65) Prior Publication Data

US 2013/0122680 A1 May 16, 2013

Related U.S. Application Data

(62) Division of application No. 12/894,087, filed on Sep. 29, 2010, now Pat. No. 8,391,049.

(51) Int. Cl.
*H01L 21/00* (2006.01)
*H01L 49/02* (2006.01)
(Continued)

(52) U.S. Cl.
CPC ................ *H01L 28/20* (2013.01); *G11C 11/22* (2013.01); *G11C 13/0004* (2013.01);
(Continued)

(58) Field of Classification Search
CPC .............. H01L 27/249; H01L 27/2463; H01L 27/2481; H01L 27/101; H01L 27/222; H01L 27/0688; H01L 45/04; H01L 45/146; H01L 45/147; H01L 45/1233; H01L 45/1675; G11C 17/165; G11C 2213/79
USPC ......... 438/240, 241, 253, 396, 397, 653, 654, 438/655, 656, 657, 671, 686
See application file for complete search history.

(56) References Cited

U.S. PATENT DOCUMENTS 680,652 A 8/1901 Elden
4,433,468 A 2/1984 Kawamata
(Continued)

FOREIGN PATENT DOCUMENTS

EP 2405441 A1 1/2012
EP 2408035 A2 1/2012
(Continued)

OTHER PUBLICATIONS

Jian Hu et al., "Area-Dependent Switching in Thin Film-Silicon Devices", Materials Research Society, Mal. Res. Soc. Symp Proc., 2003, pp. A18.3.1-A18.3.6, vol. 762.
(Continued)

*Primary Examiner* — Charles Garber
*Assistant Examiner* — Evren Seven
(74) *Attorney, Agent, or Firm* — Amin, Turocy & Watson, LLP

(57) ABSTRACT

A non-volatile resistive switching memory device. The device includes a first electrode, a second electrode, a switching material in direct contact with a metal region of the second electrode, and a resistive material disposed between the second electrode and the switching material. The resistive material has an ohmic characteristic and a resistance substantially the same as an on state resistance of the switching device. The resistive material allows for a change in a resistance of the switching material upon application of voltage pulse without time delay and free of a reverse bias after the voltage pulse. The first voltage pulse causes a programming current to flow from the second electrode to the first electrode. The resistive material further causes the programming current to be no greater than a predetermined value.

17 Claims, 9 Drawing Sheets

1103
1108
1106
1104
1102

(51) Int. Cl.
*G11C 11/22* (2006.01)
*G11C 13/00* (2006.01)
*H01L 27/24* (2006.01)
*H01L 45/00* (2006.01)

(52) U.S. Cl.
CPC ....... *G11C 13/0007* (2013.01); *G11C 13/0011* (2013.01); *G11C 13/0069* (2013.01); *H01L 27/2463* (2013.01); *H01L 45/085* (2013.01); *H01L 45/1253* (2013.01); *H01L 45/1675* (2013.01); *G11C 2213/33* (2013.01); *G11C 2213/56* (2013.01)

(56) References Cited

U.S. PATENT DOCUMENTS 4,684,972 A 8/1987 Owen et al.
4,741,601 A 5/1988 Saito
5,139,911 A * 8/1992 Yagi et al. ....................... 430/66
5,242,855 A 9/1993 Oguro
5,278,085 A 1/1994 Maddox, III et al.
5,315,131 A 5/1994 Kishimoto et al.
5,335,219 A 8/1994 Ovshinsky et al.
5,360,981 A 11/1994 Owen et al.
5,457,649 A 10/1995 Eichman et al.
5,538,564 A 7/1996 Kaschmitter
5,541,869 A 7/1996 Rose et al.
5,594,363 A 1/1997 Freeman et al.
5,614,756 A 3/1997 Forouhi et al.
5,645,628 A 7/1997 Endo et al.
5,714,416 A 2/1998 Eichman et al.
5,751,012 A 5/1998 Wolstenholme et al.
5,840,608 A 11/1998 Chang
5,970,332 A 10/1999 Pruijmboom et al.
5,973,335 A * 10/1999 Shannon ......................... 257/49
5,998,244 A 12/1999 Wolstenholme et al.
6,128,214 A 10/2000 Kuekes et al.
6,143,642 A 11/2000 Sur, Jr. et al.
6,199,484 B1 * 3/2001 Martinez-Tovar et al. 102/202.4
6,259,116 B1 7/2001 Shannon
6,288,435 B1 * 9/2001 Mei et al. ...................... 257/458
6,291,836 B1 9/2001 Kramer et al.
6,436,765 B1 8/2002 Liou et al.
6,436,818 B1 8/2002 Hu et al.
6,492,694 B2 12/2002 Noble et al.
6,627,530 B2 9/2003 Li et al.
6,762,474 B1 7/2004 Mills, Jr.
6,768,157 B2 7/2004 Krieger et al.
6,815,286 B2 11/2004 Krieger et al.
6,821,879 B2 * 11/2004 Wong ........................... 438/618
6,838,720 B2 1/2005 Krieger et al.
6,858,481 B2 2/2005 Krieger et al.
6,858,482 B2 2/2005 Gilton
6,864,127 B2 3/2005 Yamazaki et al.
6,864,522 B2 3/2005 Krieger et al.
6,881,994 B2 * 4/2005 Lee et al. ...................... 257/296
6,927,430 B2 8/2005 Hsu
6,939,787 B2 9/2005 Ohtake et al.
6,946,719 B2 9/2005 Petti et al.
7,020,006 B2 3/2006 Chevallier et al.
7,023,093 B2 4/2006 Canaperi et al.
7,026,702 B2 4/2006 Krieger et al.
7,102,150 B2 9/2006 Harshfield et al.
7,122,853 B1 10/2006 Gaun et al.
7,187,577 B1 3/2007 Wang et al.
7,221,599 B1 5/2007 Gaun et al.
7,238,607 B2 7/2007 Dunton et al.
7,254,053 B2 8/2007 Krieger et al.
7,289,353 B2 10/2007 Spitzer et al.
7,324,363 B2 1/2008 Kerns et al.
7,365,411 B2 4/2008 Campbell
7,405,418 B2 7/2008 Happ et al.
7,426,128 B2 9/2008 Scheuerlein
7,433,253 B2 10/2008 Gogl et al.
7,474,000 B2 1/2009 Scheuerlein et al.
7,479,650 B2 1/2009 Gilton
7,499,355 B2 3/2009 Scheuerlein et al.
7,521,705 B2 4/2009 Liu
7,534,625 B2 5/2009 Karpov et al.
7,541,252 B2 6/2009 Eun et al.
7,550,380 B2 6/2009 Elkins et al.
7,566,643 B2 7/2009 Czubatyi et al.
7,606,059 B2 10/2009 Toda
7,615,439 B1 11/2009 Schricker et al.
7,629,198 B2 * 12/2009 Kumar et al. ................ 438/104
7,719,001 B2 5/2010 Nomura et al.
7,728,318 B2 6/2010 Raghuram et al.
7,729,158 B2 6/2010 Toda et al.
7,749,805 B2 7/2010 Pinnow et al.
7,772,581 B2 8/2010 Lung
7,778,063 B2 8/2010 Brubaker et al.
7,786,464 B2 8/2010 Nirschl et al.
7,786,589 B2 8/2010 Matsunaga et al.
7,824,956 B2 11/2010 Schricker et al.
7,829,875 B2 11/2010 Scheuerlein
7,835,170 B2 11/2010 Bertin et al.
7,859,884 B2 12/2010 Scheuerlein
7,875,871 B2 1/2011 Kumar et al.
7,881,097 B2 2/2011 Hosomi et al.
7,883,964 B2 * 2/2011 Goda et al. .................... 438/258
7,897,953 B2 3/2011 Liu
7,898,838 B2 3/2011 Chen et al.
7,920,412 B2 4/2011 Hosotani et al.
7,924,138 B2 4/2011 Kinoshita et al.
7,968,419 B2 6/2011 Li et al.
7,972,897 B2 * 7/2011 Kumar et al. ................ 438/104
7,984,776 B2 7/2011 Beyer et al.
8,004,882 B2 8/2011 Katti et al.
8,018,760 B2 9/2011 Muraoka et al.
8,021,897 B2 9/2011 Sills et al.
8,045,364 B2 10/2011 Schloss et al.
8,054,674 B2 11/2011 Tamai et al.
8,067,815 B2 11/2011 Chien et al.
8,071,972 B2 12/2011 Lu et al.
8,084,830 B2 12/2011 Kanno et al.
8,088,688 B1 1/2012 Herner
8,097,874 B2 1/2012 Venkatasamy et al.
8,102,698 B2 1/2012 Scheuerlein
8,143,092 B2 3/2012 Kumar et al.
8,144,498 B2 3/2012 Kumar et al.
8,164,948 B2 4/2012 Katti et al.
8,168,506 B2 5/2012 Herner
8,183,553 B2 5/2012 Phatak et al.
8,187,945 B2 5/2012 Herner
8,198,144 B2 6/2012 Herner
8,207,064 B2 6/2012 Bandyopadhyay et al.
8,227,787 B2 7/2012 Kumar et al.
8,231,998 B2 7/2012 Ablano et al.
8,233,308 B2 7/2012 Schricker et al.
8,237,146 B2 8/2012 Kreupl et al.
8,258,020 B2 9/2012 Herner
8,274,812 B2 9/2012 Jo et al.
8,315,079 B2 11/2012 Kuo et al.
8,320,160 B2 11/2012 Nazarian
8,374,018 B2 2/2013 Lu
8,385,100 B2 2/2013 Kau et al.
8,394,670 B2 3/2013 Herner
8,467,227 B1 6/2013 Jo
8,658,476 B1 2/2014 Sun et al.
8,659,003 B2 2/2014 Herner et al.
2003/0141565 A1 7/2003 Hirose et al.
2004/0026682 A1 2/2004 Jiang
2004/0170040 A1 9/2004 Rinerson et al.
2004/0202041 A1 10/2004 Hidenori
2005/0020510 A1 1/2005 Benedict
2005/0029587 A1 2/2005 Harshfield
2005/0062045 A1 3/2005 Bhattacharyya
2005/0101081 A1 * 5/2005 Goda et al. .................... 438/222
2006/0134837 A1 6/2006 Subramanian et al.
2006/0246606 A1 11/2006 Hsu et al.
2006/0281244 A1 12/2006 Ichige et al.
2007/0008773 A1 1/2007 Scheuerlein
2007/0015348 A1 1/2007 Hsu et al.
2007/0087508 A1 4/2007 Herner

(56) References Cited

U.S. PATENT DOCUMENTS

2007/0090425 A1 4/2007 Kumar et al.
2007/0105284 A1 5/2007 Herner
2007/0105390 A1 5/2007 Oh
2007/0205510 A1 9/2007 Lavoie et al.
2007/0228414 A1 10/2007 Kumar et al.
2007/0284575 A1 12/2007 Li et al.
2007/0290186 A1 12/2007 Bourim et al.
2008/0002481 A1 1/2008 Gogl et al.
2008/0006907 A1 1/2008 Lee et al.
2008/0048164 A1 2/2008 Odagawa
2008/0089110 A1 4/2008 Robinett et al.
2008/0090337 A1 4/2008 Williams
2008/0106925 A1 5/2008 Paz De Araujo et al.
2008/0106926 A1 5/2008 Brubaker et al.
2008/0185567 A1 8/2008 Kumar et al.
2008/0206931 A1 8/2008 Breuil et al.
2008/0220601 A1* 9/2008 Kumar et al. ................ 438/585
2008/0278990 A1 11/2008 Kumar et al.
2008/0304312 A1 12/2008 Ho et al.
2008/0311722 A1 12/2008 Petti et al.
2009/0001345 A1 1/2009 Schricker et al.
2009/0014707 A1 1/2009 Lu et al.
2009/0052226 A1 2/2009 Lee et al.
2009/0095951 A1 4/2009 Kostylev et al.
2009/0152737 A1 6/2009 Harshfield
2009/0168486 A1 7/2009 Kumar
2009/0231910 A1 9/2009 Liu et al.
2009/0250787 A1 10/2009 Kutsunai
2009/0256130 A1 10/2009 Schricker
2009/0257265 A1 10/2009 Chen et al.
2009/0267047 A1* 10/2009 Sasago et al. .................... 257/4
2009/0298224 A1 12/2009 Lowrey
2009/0321789 A1 12/2009 Wang et al.
2010/0012914 A1 1/2010 Xu et al.
2010/0019221 A1 1/2010 Lung et al.
2010/0019310 A1 1/2010 Sakamoto
2010/0032637 A1 2/2010 Kinoshita et al.
2010/0032638 A1 2/2010 Xu
2010/0032640 A1 2/2010 Xu
2010/0044708 A1* 2/2010 Lin et al. ........................ 257/59
2010/0084625 A1 4/2010 Wicker et al.
2010/0085798 A1 4/2010 Lu et al.
2010/0090192 A1 4/2010 Goux et al.
2010/0101290 A1 4/2010 Bertolotto
2010/0102290 A1 4/2010 Lu et al.
2010/0157651 A1 6/2010 Kumar et al.
2010/0157710 A1 6/2010 Lambertson et al.
2010/0163828 A1 7/2010 Tu
2010/0176368 A1 7/2010 Ko et al.
2010/0219510 A1 9/2010 Scheuerlein et al.
2010/0221868 A1 9/2010 Sandoval
2010/0321095 A1 12/2010 Mikawa et al.
2011/0006275 A1 1/2011 Roelofs et al.
2011/0089391 A1 4/2011 Mihnea et al.
2011/0128779 A1 6/2011 Redaelli et al.
2011/0133149 A1 6/2011 Sonehara
2011/0136327 A1 6/2011 Han et al.
2011/0155991 A1 6/2011 Chen
2011/0198557 A1 8/2011 Rajendran et al.
2011/0204312 A1 8/2011 Phatak
2011/0205782 A1 8/2011 Costa et al.
2011/0212616 A1 9/2011 Seidel et al.
2011/0227028 A1 9/2011 Sekar et al.
2011/0284814 A1 11/2011 Zhang
2011/0305064 A1 12/2011 Jo et al.
2011/0312151 A1 12/2011 Herner
2011/0317470 A1 12/2011 Lu et al.
2012/0001146 A1 1/2012 Lu et al.
2012/0007035 A1 1/2012 Jo et al.
2012/0008366 A1 1/2012 Lu
2012/0012806 A1 1/2012 Herner
2012/0015506 A1 1/2012 Jo et al.
2012/0025161 A1 2/2012 Rathor et al.
2012/0033479 A1 2/2012 Delucca et al.
2012/0043519 A1 2/2012 Jo et al.
2012/0043520 A1 2/2012 Herner et al.
2012/0043621 A1 2/2012 Herner
2012/0043654 A1 2/2012 Lu et al.
2012/0080798 A1 4/2012 Harshfield
2012/0104351 A1 5/2012 Wei et al.
2012/0108030 A1 5/2012 Herner
2012/0142163 A1 6/2012 Herner
2012/0145984 A1 6/2012 Rabkin et al.
2012/0155146 A1 6/2012 Ueda et al.
2012/0205606 A1 8/2012 Lee et al.
2012/0220100 A1 8/2012 Herner
2012/0235112 A1 9/2012 Huo et al.
2012/0236625 A1 9/2012 Ohba et al.
2012/0305874 A1 12/2012 Herner
2012/0326265 A1 12/2012 Lai et al.
2013/0026440 A1 1/2013 Yang et al.
2014/0070160 A1 3/2014 Ishikawa et al.

FOREIGN PATENT DOCUMENTS

KR 1020110014248 A 2/2011
WO WO 2009/005699 A1 1/2009
WO WO 2011/133138 A1 10/2011

OTHER PUBLICATIONS

André Dehon, "Array-Based Architecture for FET-Based, Nanoscale Electronics", IEEE Transactions on Nanotechnology, Mar. 2003, pp. 23-32, vol. 2, No. 1, IEEE.
Herb Goronkin et al., "High-Performance Emerging Solid-State Memory Technologies", MRS Bulletin, www.mrs.org/publications/bulletin, Nov. 2004, pp. 805-813.
Gerhard Müller et al., "Status and Outlook of Emerging Nonvolatile Memory Technologies", IEEE, 2004, pp. 567-570.
A.E. Owen et al., "Memory Switching in Amorphous Silicon Devices", Journal of Non-Crystalline Solids 59 & 60,1983, pp. 1273-1280, North Holland Publishing Company/Physical Society of Japan.
J. Campbell Scott, "Is There an Immortal Memory?", www.sciencemag.org, Apr. 2, 2004, pp. 62-63, vol. 304 No. 5667, American Association for the Advancement of Science.
S.H. Lee et al., "Full Integration and Cell Characteristics for 64Mb Nonvolatile PRAM", 2004 Symposium on VLSI Technology Digest of Technical Papers, IEEE, 2004, pp. 20-21.
Stephen Y. Chou et al., "Imprint Lithography With 25-Nanometer Resolution", Science, Apr. 5, 1996, pp. 85-87, vol. 272, American Association for the Advancement of Science.
S. Zankovych et al., "Nanoimprint Lithography: challenges and prospects", Nanotechnology, 2001, pp. 91-95, vol. 12, Institute of Physics Publishing.
A. Avila et al., "Switching in coplanar amorphous hydrogenated silicon devices", Solid-State Electronics, 2000, pp. 17-27, vol. 44, Elsevier Science Ltd.
Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.
S. Hudgens et al., "Overview of Phase-Change Chalcogenide Nonvolatile Memory Technology", MRS Bulletin, www.mrs.org/publications/bulletin, Nov. 2004, pp. 829-832.
K. Terabe et al., "Quantized conductance atomic switch", Nature, www.nature.com/nature, Jan. 6, 2005, pp. 47-50, vol. 433, Nature Publishing Group.
Michael Kund et al., "Conductive bridging RAM (CBRAM): An emerging non-volatile memory technology scalable to sub 20nm", IEEE, 2005.
W. Den Boer, "Threshold switching in hydrogenated amorphous silicon", Appl. Phys. Letter, 1982, pp. 812-813, vol. 40, American Institute of Physics.
P.G. Lecomber et al., "The Switching Mechanism in Amorphous Silicon Junctions", Journal of Non-Crystalline Solids,1985, pp. 1373-1382, vol. 77 & 78, Elsevier Science Publishers B.V., North Holland Physics Publishing Division, North-Holland, Amsterdam.

(56) References Cited

OTHER PUBLICATIONS

A. E. Owen et al., "Switching in amorphous devices", Int. J. Electronics, 1992, pp. 897-906, vol. 73, No. 5, Taylor and Francis Ltd.
M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, 10, 1297-1301, 2010, pubs.acs.org/NanoLett, A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", $9^{th}$ Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of Cr/$p^+$a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.

(56) References Cited

OTHER PUBLICATIONS

Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct. 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Notice of Allowance for U.S. Appl. No. 12/814,410 dated Jan. 8, 2013.
Corrected Notice of Allowance for U.S. Appl. No. 12/861,666 dated Jan. 11, 2013.
Supplemental Notice of Allowance for U.S. Appl. No. 12/894,087 dated Jan. 11, 2013.
Notice of Allowance for U.S. Appl. No. 13/314,513 dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264 dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432 dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312 filed on Jul. 2, 2012.
Office Action for U.S. Appl. No. 13/466,008, dated Jul. 29, 2013.
Russo, U. et al, "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, Issue 2.
Cagli, C. et al, "Evidence for threshold switching in the set process of NiO-based RRAM and physical modeling for set, reset, retention and disturb prediction", 2008 IEEE International Electron Devices Meeting (IEDM), Dec. 15-17, 2008, pp. 1-4, San Francisco, CA, USA.
Office Action for U.S. Appl. No. 13/077,941, dated Aug. 12, 2013.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feburary 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Patent Application No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti—W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Office Action of U.S. Appl. No. 13/436,714 dated Dec. 7, 2012.
Office Action of U.S. Appl. No. 13/436,714 dated Aug. 27, 2013.
Notice of Allowance for U.S. Appl. No. 13/679,976, dated Sep. 17, 2013.
Office Action for U.S. Appl. No. 13/189,401 dated Sep. 30, 2013.
Office Action for U.S. Appl. No. 13/462,653 dated Sep. 30, 2013.
Corrected Notice of Allowability for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665 dated Aug. 2, 2013.
Notice of Allowance for U.S. Appl. No. 13/769,152, dated Oct. 8, 2013.
Notice of Allowance for U.S. Appl. No. 13/905,074 , dated Oct. 8, 2013.
Notice of Allowability for U.S. Appl. No. 13/452,657, dated Oct. 10, 2013.
Notice of Allowance for U.S. Appl. No. 13/174,264, dated Oct. 16, 2013.
Notice of Allowability for U.S. Appl. No. 13/417,135, dated Oct. 23, 2013.
Office Action for U.S. Appl. No. 12/861,432, dated Mar. 29, 2013.
Notice of Allowance for U.S. Appl. No. 13/725,331, dated Jan. 17, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 13/434,567, dated Feb. 6, 2014.
Office Action for U.S. Appl. No. 13/620,012, dated Feb. 11, 2014.
Notice of Allowance for U.S. Appl. No. 13/468,201, dated Feb. 20, 2014.
Office Action for U.S. Appl. No. 12/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/705,082, dated Sep. 2, 2014.
Office Action for U.S. Appl. No. 13/739,283, dated Sep. 11, 2014.
Office Action for U.S. Appl. No. 13/756,498, dated Sep. 12, 2014.
Notice of Allowance for U.S. Appl. No. 13/462,653 dated Sep. 17, 2014.

(56) References Cited

OTHER PUBLICATIONS

Notice of Allowance for U.S. Appl. No. 13/586,815, dated Sep. 18, 2014.

Notice of Allowance for U.S. Appl. No. 13/920,021, dated Sep. 18, 2014.

Office Action for U.S. Appl. No. 13/189,401, dated Sep. 22, 2013.

Notice of Allowance for U.S. Appl. No. 13/594,665 dated Sep. 26, 2014.

Notice of Allowance for U.S. Appl. No. 13/077,941, dated Oct. 8, 2014.

Notice of Allowance for U.S. Appl. No. 13/077,941, dated Aug. 27, 2014.

* cited by examiner 100
104
106
102
110
108
114
112

RESISTOR STRUCTURE FOR A NON-VOLATILE MEMORY DEVICE AND METHOD

CROSS REFERENCE TO RELATED APPLICATIONS

The present invention claims priority to and is a divisional of U.S. patent application Ser. No. 12/894,087, filed Sep. 29, 2010, the disclosures of which are hereby incorporated herein by reference for all purposes.

STATEMENTS RELATED TO FEDERAL OR GOVERNMENT SPONSORED RESEARCH

Not Applicable

BACKGROUND

The present invention is related to switching devices. More particularly, the present invention provides a resistive switching device characterized by a controllable programming current with faster operation speed. Embodiments of the present invention have been applied to fabrication and operation of a resistive random access memory device. But it should be recognized that the present invention can have a much broader range of applicability.

The success of semiconductor devices has been mainly driven by an intensive transistor down-scaling process. However, as field effect transistors (FET) approach sizes less than 100 nm, problems such as short channel effect can degrade device performance. Moreover, such sub 100 nm device size can lead to sub-threshold slope non-scaling and also increases power dissipation. It is generally believed that transistor-based memories such as those commonly known as Flash may approach an end to scaling within a decade.

Other non-volatile random access memory devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, FeRAM and MRAM devices have fast switching characteristics and good programming endurance, but their fabrication is not CMOS compatible and size is usually large. Switching for a PCRAM device requires a high power. Organic RAM is incompatible with large volume silicon-based fabrication and device reliability is usually poor. Desirable attributes of a high density device should include high switching speed, reliable switching, and high endurance, among others.

From the above, a new semiconductor device structure and integration is desirable.

BRIEF SUMMARY OF THE PRESENT INVENTION

The present invention is related to switching devices. More particularly, the present invention provides a resistive switching device characterized by a controllable programming current with faster operation speed. Embodiments of the present invention have been applied to fabrication and operation of a resistive random access memory device. But it should be recognized that the present invention can have a much broader range of applicability In a specific embodiment, a method for programming a non-volatile resistive switching memory device is provided. The method includes providing a switching device. The switching device includes a first electrode, a switching material overlying the first electrode, a second electrode comprising at least a metal material overlying the switching material, and a resistive material disposed between the first electrode and the switching material. In a specific embodiment, the resistive material has an ohmic characteristic and is characterized by a resistance substantially the same as an on state resistance of the switching device. The method includes applying a first voltage pulse to the second electrode to cause a change in state of the switching device from a first state to a second state. The first state is a first resistance state and the second state is a second resistance state. In a specific embodiment, the change of state is free of a time delay associated with a resistance element coupled to the resistive switching device and free of a reverse bias after the first voltage pulse. The voltage pulse further causes a programming current to flow in the switching device. The resistive material is configured to cause the programming current to be no greater than a predetermined value in a specific embodiment.

In a specific embodiment, a non-volatile resistive switching memory device is provided. The device includes a first electrode, a second electrode, and a switching material. In a specific embodiment. The second electrode includes a metal region in direct with the switching material in a specific embodiment. The device includes a resistive material disposed between the second electrode and the switching material in a specific embodiment. Preferably, the resistive material has an ohmic characteristic and has a resistance substantially the same as an on state resistance of the switching device.

In a specific embodiment, an array of memory cells is provided. The array of memory cells includes one or more first structure spatially configured to extend in a first direction. Each of the first structure includes a first electrode, a resistive material overlying the first electrode, and a metal material overlying resistive material. The first structure is spatially configured to extending in a first direction in a specific embodiment. The array of memory includes one or more switching elements overlying the metal material of the first structure. A second electrode overlies each of the one or more switching elements. In a specific embodiment, the second electrode is spatially configured to extend in a second direction orthogonal to the first direction.

In a specific embodiment, an array of memory cells is provided. The array of memory cells include one or more first electrode spatially configured to extend in a first direction and a plurality of first structures. Each of the first structures includes a resistive material overlying the first electrode, a metal material overlying the resistive material, and a switching material overlying the metal material. The array of memory cells includes a second electrode structure overlying the switching material of each of the first structures. The second electrode structure is spatially configured to extend in a second direction orthogonal to the first direction in a specific embodiment.

In a specific embodiment, a method of forming a memory device is provided. The method includes providing a semiconductor substrate having a surface region and forming a first dielectric material overlying the surface region of the semiconductor substrate. The method includes forming a first electrode material overlying the first dielectric material and forming a resistive material overlying the first electrode material. A metal material is formed overlying the resistive material and a switching material is formed overlying the metal material. In a specific embodiment, the method subjects the first electrode material the resistive material, the metal material, and the switching material to a first pattern and etch process to form a first structure. The first structure is elongated in shape and extending in a first direction in a specific embodiment. The method subjects the switching material to a second pattern and etch process to form one or more switching elements overlying the metal material. A second electrode structure is formed extending in a second direction spatially perpendicular to the first electrode structure overlying the one or more switching elements in a specific embodiment. The method includes forming one or more switching device from the first electrode structure, the resistive material, the metal material, the one or more switching elements and the second electrode structure in a specific embodiment.

In a specific embodiment, a method of forming a memory device is provided. The method includes providing a semiconductor substrate having a surface region. A first dielectric material is formed overlying the surface region of the semiconductor substrate. The method includes forming a first electrode material overlying the first dielectric material and forming a resistive material overlying the first electrode material. The method further forms a metal material overlying the resistive material and a switching material overlying the metal material. In a specific embodiment, the method subjects the first electrode material the resistive material, the metal material, and the switching material to a first pattern and etch process to form a first structure. The first structure is elongated in shape and extending in a first direction in a specific embodiment. In a specific embodiment, the method includes subjecting the resistive material, the metal material, and the switching material to a second pattern and etch process to form one or more switching elements and to form one or more resistor associated with the respective one or more switching element overlying the metal material. A second electrode structure extending in a second direction and spatially perpendicular to the first electrode structure is formed overlying at least the switching element. The method forms one or more switching devices from at least the first electrode structure, the one or more switching elements, the respective resistor device associated with the one or more switching element, and the second electrode structure. In a specific embodiment, the one or more resistor causes a programming current to be no greater than a predetermined current in the switching element upon application of a programming voltage to the first electrode or the second electrode.

Many benefits can be achieved by ways of the present invention over conventional techniques. For example, the present invention provides a method and a device structure for a switching device having a built in resistor. The built in resistor eliminates an external circuitry for current compliance and the undesirable features associated with the external circuitry (for example, RC delay, and unintended erase cycle, among others). Additionally, as no external circuitry needs to be designed in, the present device structure allows for a reduced device size and a less complex device design. Depending upon the embodiment, one or more of these benefits may be achieved. One skilled in the art would recognize other variations, modifications, and alternatives.

DETAILED DESCRIPTION OF THE PRESENT INVENTION

The present invention is related to switching devices. More particularly, the present invention provides a structure for forming a resistive switching device and a method for controlling programming current during operations. The present invention has been applied to a non-volatile resistive switching device. But it should be recognized that embodiments according the present invention can have a much broader range of applicability.

The growth of consumer devices has led to an ever increasing demand for high density memory storage at a low cost per bit. Data storage of current non-volatile memory devices are based on charges stored in a floating gate or a dielectric layer. Scaling of these devices is limited as these devices usually require a transistor device coupled to a memory cell. Further down scale of transistors may not be possible due to short channel effects and others. Additionally, as these devices are three terminal devices, vertical or three dimensional integration of memory cells are difficult to achieve. Memory cells or switching devices arranged in a crossbar configuration provides a method and a structure for high density integration at a much reduced cost.

To ensure proper function of a switching device, programming current needs to be controlled. Too high a current during programming (for example, writing or reading) would damage the switching device causing device failure. Conventionally, programming current can be controlled by a current compliance from external circuits such as an external resistor or transistor which is serially coupled to the switching device. The series resistor or transistor can be provided in front of the switching device or behind the switching device, and the programming current is approximately the same as the current through the series resistor or transistor. However, such current compliance causes undesirable effects in a highly interconnected crossbar structure.

Figures 1A, 1B, 1C:
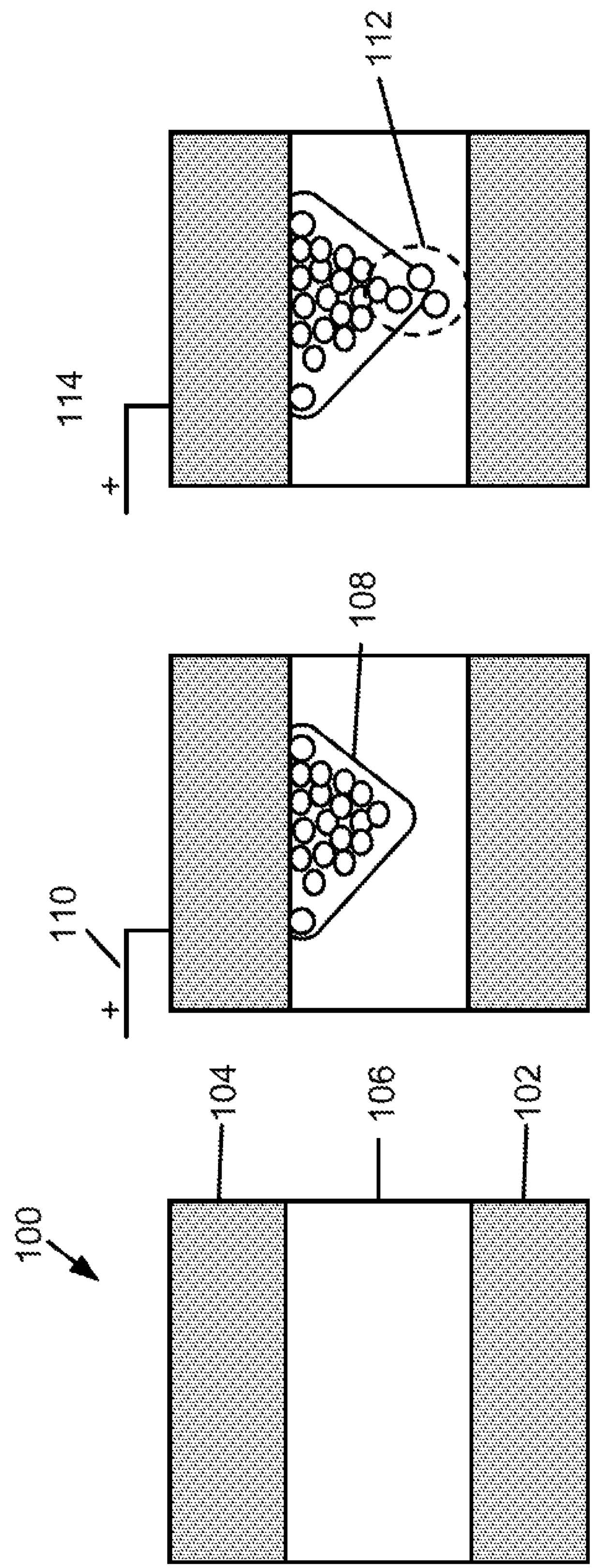
FIGS. 1*a*, 1*b*, and 1*c* are simplified diagrams illustrating a switching device and its operation according to an embodiment of the present invention.

FIG. 1*a* is simplified diagram of an as fabricated switching device 100. The as fabricated switching device includes a first electrode 102, a second electrode 104, and a switching material 106 sandwiched between the first electrode and the second electrode. The switching material is characterized by a resistance depending on a voltage applied to the first electrode or the second electrode. Depending on the embodiment, the switching material can be a metal oxide, a solid electrolyte, or an amorphous silicon material, among others. The first electrode and the second electrode can be metal materials, or a doped semiconductor material depending on the application.

As merely an example, for amorphous silicon as the switching material, the second electrode can have a portion that includes a metal material. The metal material can be silver, platinum, palladium, gold, nickel, and others. The metal material is characterized by a suitable diffusivity in the switching material. As shown in FIG. 1*b*, a metal region 108 is formed in a portion of the amorphous silicon material when a first voltage 110 greater than a first threshold voltage is applied to the second electrode in an electroforming process. The switching device is in an off-state and characterized by an off state resistance and an off state current flows in the switching material. When a second voltage 114 greater than a second threshold voltage is applied to the first electrode as shown in FIG. 1 *c* after the electroforming process, the metal region further forms a filament structure 112 that expands or retracts in length depending on polarity and magnitude of a programming voltage or operating voltage applied to the device. The device is now in an on-state and characterized by an on-state resistance and an on state current flows from the second electrode to the first electrode. The metal region including the filament structure determines the resistance of the amorphous silicon material. For proper operation of the switching device, the on-state current needs to be controlled to prevent damage caused by excessive heating in the device. For metal oxide as the switching material, the change in resistance in the metal oxide material can be caused by a migration of defects along a conduction path, which can comprise of metal deficient sites or oxygen deficient sites depending on the metal oxide material.

Figure 2:
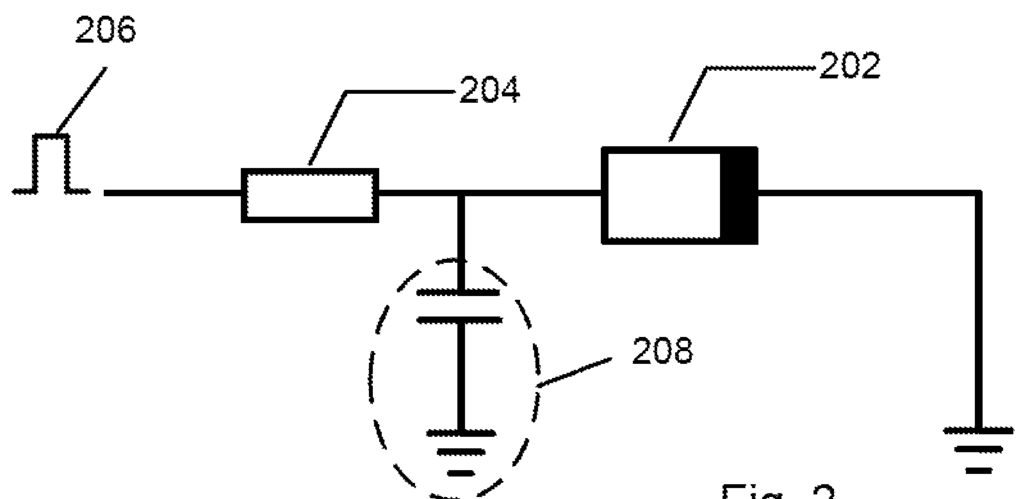
FIGS. 2 and 3 are simplified diagrams illustrating conventional ways to provide current compliance for a switching device.

FIG. 2 is a simplified diagram illustrating a conventional method of controlling a programming current (for example, an on-state current) in a switching device 202. During programming, a voltage 206 applied to the switching device causes a change in a resistance of the switching device and an electrical current or programming current flows in the switching device. The voltage can be a voltage pulse or a voltage ramp depending on the application. To control programming current in the switching device, an external resistor 204 is serially connected to the switching device in the conventional method. The external resistor can be a resistor or a transistor. The external resistor functions as a current compliance and can be formed connected to a word line or a bit line in an array to control a maximum allowable current to flow in the switching device to prevent damage to the switching device. As shown in FIG. 2, the external resistor is configured between voltage source 206 and the switching device or in front of the switching device. As the various connections, for example, metal wires, cables connecting the external resistor and the switching device incur certain level of parasitic capacitance in the connections, programming delay due to RC (resistance-capacitance) time constant results. Even for a very low sub-pF range capacitance, the RC delay can be significant, since resistance value would be large to limit the programming current. As an example, for a programming current of one uA, the serial resistor needs to have a resistance of about one Mohm. A capacitance in the connections of about 0.05 pF would lead to an RC delay of 50 ns thus limiting programming speed of the device. In this configuration, that is, the series resistor in front of the switching device, the switching device cannot be programmed using a short voltage pulse of less than, for example 50 ns due to the delay with a simple circuitry. An extensive circuit may be required to offer a faster speed, at the expense of large chip size.

Figure 3:
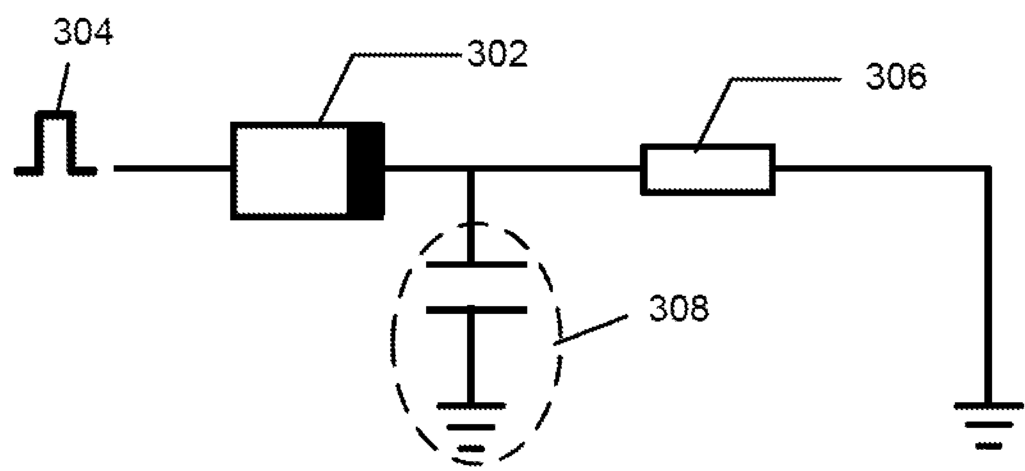

FIG. 3 is another conventional method of controlling programming current in a switching device. In this arrangement, a switching device 302 is configured in between the voltage source 304 and a series resistor (or transistor) 306 or the series resistor is behind the switching device. After the switching device is programmed, a parasitic capacitor 308 can form between the switching device and the resistance. The capacitor is charged during programming. The charged capacitor can generate a reverse bias to the switching device after programming and may cause unintentional erase to the switching device.

Figure 4:
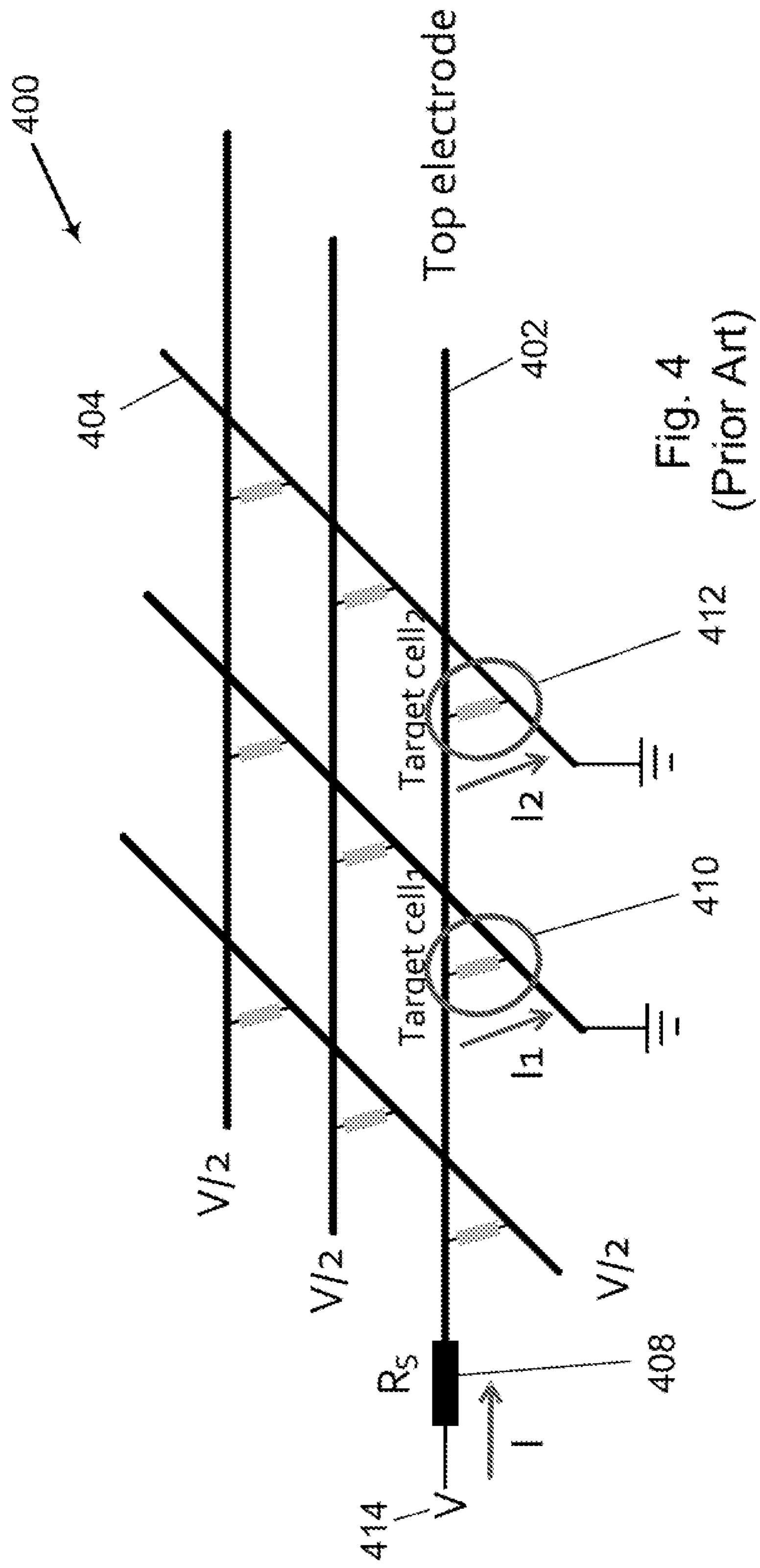
FIGS. 4 and 5 are simplified diagrams illustrating conventional ways to provide current compliance for a crossbar array of switching devices.
Figure 5:
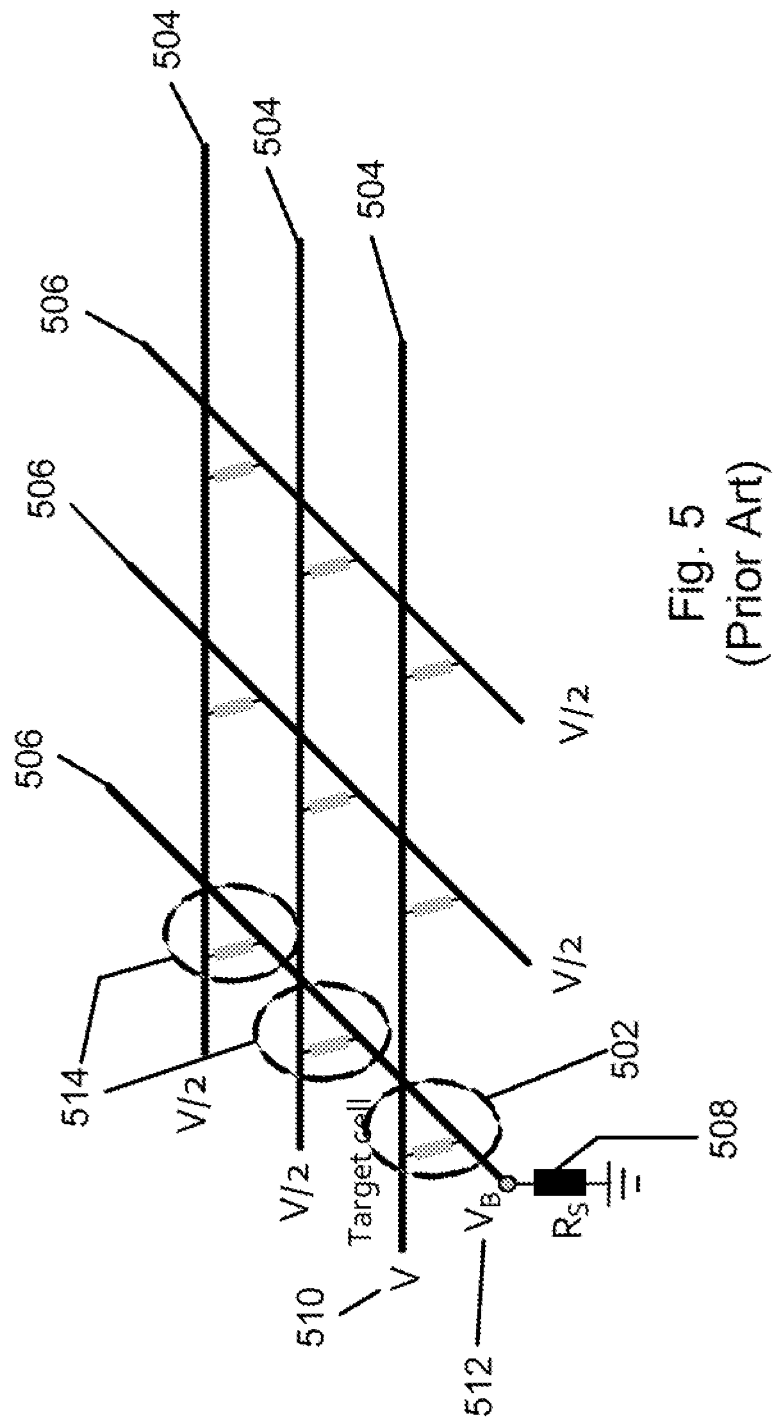

Besides these device level operation issues, conventional approaches also cause problems in array level operations. FIGS. 4 and 5 illustrate limitations of using a conventional external series resistor for controlling programming current in an interconnected crossbar array. FIG. 4 illustrates an array 400 of switching devices arranged in an interconnected crossbar configuration. As shown, the array includes a plurality of first electrodes 402 extending in a first direction and arranged in a parallel manner. The array includes a plurality of second electrodes 404 extending in a second direction, spatially orthogonal to the first direction. A switching region is disposed in each of intersecting region between the first electrode and the second electrode to form a switching device. A current compliance 408 having a resistance Rs is configured before a bit line as shown. The current compliance can be a series resistor or series transistors depending on the application. A voltage 414 is applied to the bit line to program cells 410 and 412, for example. If N cells connected by the same bit line need to be programmed simultaneously, the resistance Rs of the current compliance cannot be greater than Rs1/N, where Rs1 is the resistance of the series resistor when only one cell is selected to be programmed. This is to allow sufficient current for all N target cells. As the cells in an array may not have the same switching time, a cell having a faster switching may be damaged since Rs may be too small and a large current is allowed to pass through the faster switching cell. Therefore this configuration has limitation for simultaneous programming of multiple cells.

FIG. 5 illustrates a crossbar array of switching devices using another conventional external series resistor for controlling programming current in an interconnected crossbar array. The switching device has a serially connected resistor or current compliance behind a switching device as in FIG. 3, that is, the switching device is configured between the resistor and a voltage source. As an example, cell 502 is a selected cell for programming. As shown, the current compliance is coupled to the second electrode of the selected cell and behind a wordline. When a first voltage 510 is applied to the first electrode of the selected switching device 502, a second voltage 512 between the second electrode of the selected switching device and ground would increase due to a voltage divider effect. The voltage divider effect in unselected switching devices 514 sharing the common second electrode would have voltage of V/2 between the second electrode and ground. If a number of cells sharing a second electrode are at a low resistant on-state, the selected cell may not be able to be programmed due to increased potential $V_B$.

Accordingly, embodiments according to the present invention provide a device structure and method to control a programming (write, read, or erase) current in a switching device to prevent device damage during operations. Embodiments according to present invention eliminate an external resistor or a current compliance that needs to be designed into a memory array and does not affect proper operations of each of the device in the array, resulting in smaller device size and faster device operations. A built-in resistive layer as a part of the switching device further eliminates parasitic capacitance, thus allowing faster device operation. Furthermore, the resistive layer controls a maximum current flowing through each of the switching device and eliminates an external circuitry enabling a compact cell structure and reducing overall chip size.

Figure 6:
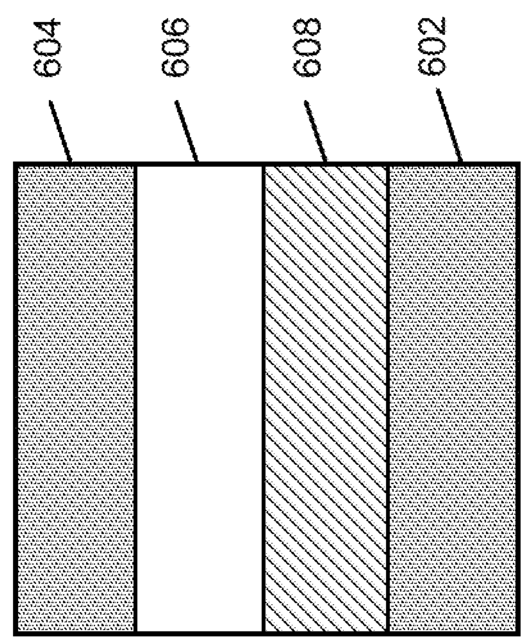

FIG. 6 is a simplified diagram of a switching device 600 according to an embodiment of the present invention. As shown, the switching device includes a first electrode 602. The first electrode can be a common metal material used in CMOS fabrication in a specific embodiment. The first electrode can include materials such as aluminum, tungsten, or copper, depending on the application.

The switching device includes a second electrode 604. The second electrode has at least a first portion that includes a metal material in a specific embodiment. The second electrode further includes a second portion for a first wiring structure for an interconnected crossbar array in a specific embodiment. In a specific embodiment, the first electrode is configured to extend in a first direction and the second electrode is spatially configured to extend in a second direction at an angle to the first electrode. The first electrode and the second electrode are arranged in an orthogonal manner in a preferred embodiment. The switching device includes a switching material 606 provided in an intersecting region between the first electrode and the second electrode.

In a specific embodiment, the switching device further includes a resistive material 608 disposed between the second electrode and the switching material. The resistive material is configured to allow a predetermined current to flow in the switching device. In a preferred embodiment, the predetermined current is less than about a maximum allowable current for the switching device. In a specific embodiment, the maximum allowable current can be an on-state current of the switching device. Additionally, the resistive material is characterized by a resistance, which is substantially the same as a desired on-state resistance of the switching device. The resistance of the resistive material does not change with the operating voltage in a specific embodiment.

Figure 7:
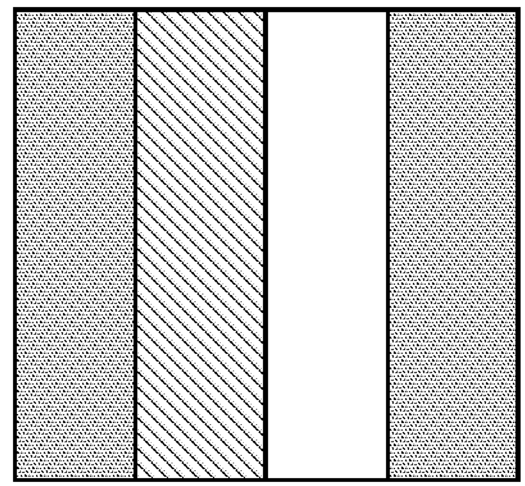
FIGS. 6 and 7 are simplified diagrams each illustrating a switching device according to embodiments of the present invention.

Alternatively, the resistive material can be disposed between the second electrode and the switching material as illustrated in FIG. 7.

In a specific embodiment, the resistive material forms a first interface region with the switching material and a second interface region with the second electrode (as in FIG. 6) or the first electrode (as in FIG. 7). The first interface region is preferably ohmic and do not have a barrier (for example, Schottky barrier) in a specific embodiment.

Figure 8:
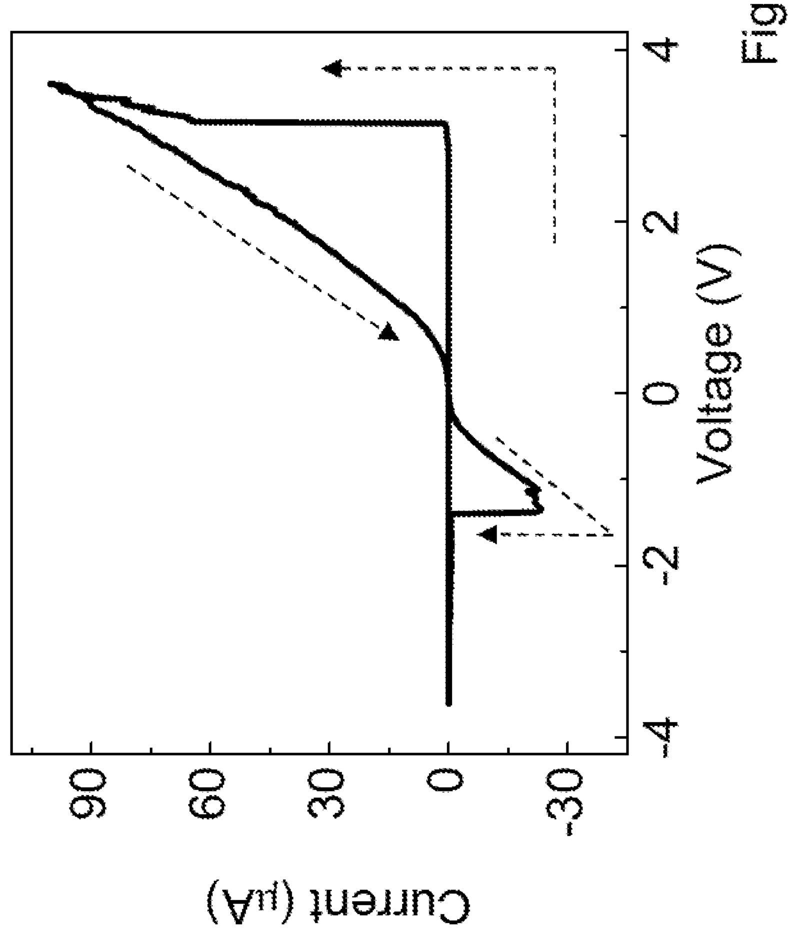
FIG. 8 is a simplified current versus voltage (I-V) curves for a conventional switching device.

For certain switching devices, there is an asymmetry between erase voltage and write voltage as shown a current versus voltage (IV) curve in FIG. 8. The IV curve is measured from a switching device having an amorphous silicon material as the switching material and a sliver material as part of the second electrode. As shown, the device has a device size of about 60 nm, a write voltage of about 3.2 volts and an erase voltage of about −1.5 volts. The erase voltage is less than the write voltage, which is not desirable. The resistive material formed within the switching device would increase the erase voltage due to a voltage divider effect between the switching device and the resistive material and make devices having low erase voltage easier to be interconnected in a crossbar array. Merely for verification:

Let Rs be the resistance of the resistive material, then select Rs~desired device Ron.

Intrinsic (without the resistive material) write voltage=Vwrite

Intrinsic (without the resistive material) erase voltage=Verase

Write voltage with the integrated resistive material Vwrite'=Vwrite*(Roff+Rs)/Roff Erase voltage with the integrated resistive material Verase'=Verase*(Ron+Rs)/Ron Since Ron~Rs, and Ron<<Roff, Vwrite'~Vwrite Verase'~2Verase.

Accordingly, the resistive material integrally formed within the switching device and having a resistance about the same as the on-state resistance of the switching device enables the erase voltage to increase and made closer to the write voltage and to achieve reliable device operations in a crossbar array. Note that, while programming selected cells, other unselected cells can be erased accidently due to programming disturbance especially if erase voltage is small.

Figure 9:
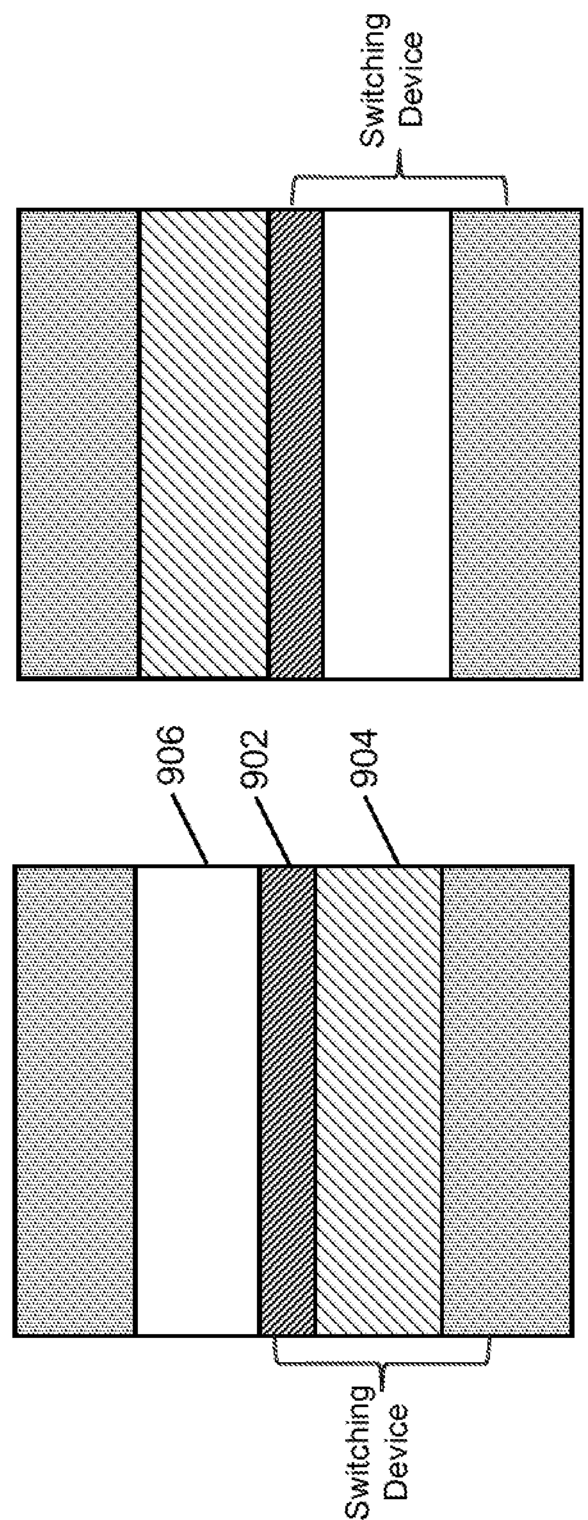
FIG. 9 is a simplified diagram illustrating a switching device and a variation according to an embodiment of the present invention.

As noted, a first interface region formed from the resistive material and an electrode needs to be ohmic. A non-ohmic interface such one having a Schottky IV characteristic would have a undesired non-linear resistance that has an exponential dependency on applied voltage. Therefore at non-ohmic interface, a small variation in programming voltage would result in a large variation in the device resistance. Furthermore, a second interface region formed between the resistive material and the switching material may need to be ohmic to improve uniformity in the device. As most switching materials are on-conducting, to prevent an non-ohmic interfaces between the switching material and the resistive material, a metal material 902 is interposed between a switching material 906 and the resistive material 904 as illustrated in the simplified diagram in FIG. 9. This metal layer 902 would also prevent metal region 108 and filament structure 112 to form in the resistive material in a specific embodiment.

Depending on the embodiment, there can be variations to obtain desired resistance for the resistive layer. For example, the resistive material can be a semiconductor material doped with a suitable impurity. In other embodiment, the resistive material can be a composite material formed by co-deposition of a metal material and an insulator material. The composite material can also be formed by co-deposition of a metal material and a semiconductor material. Depending on a metal content, the resistance of the composite material can be adjusted accordingly. Co-deposition techniques can include sputtering, and the likes.

Figure 10:
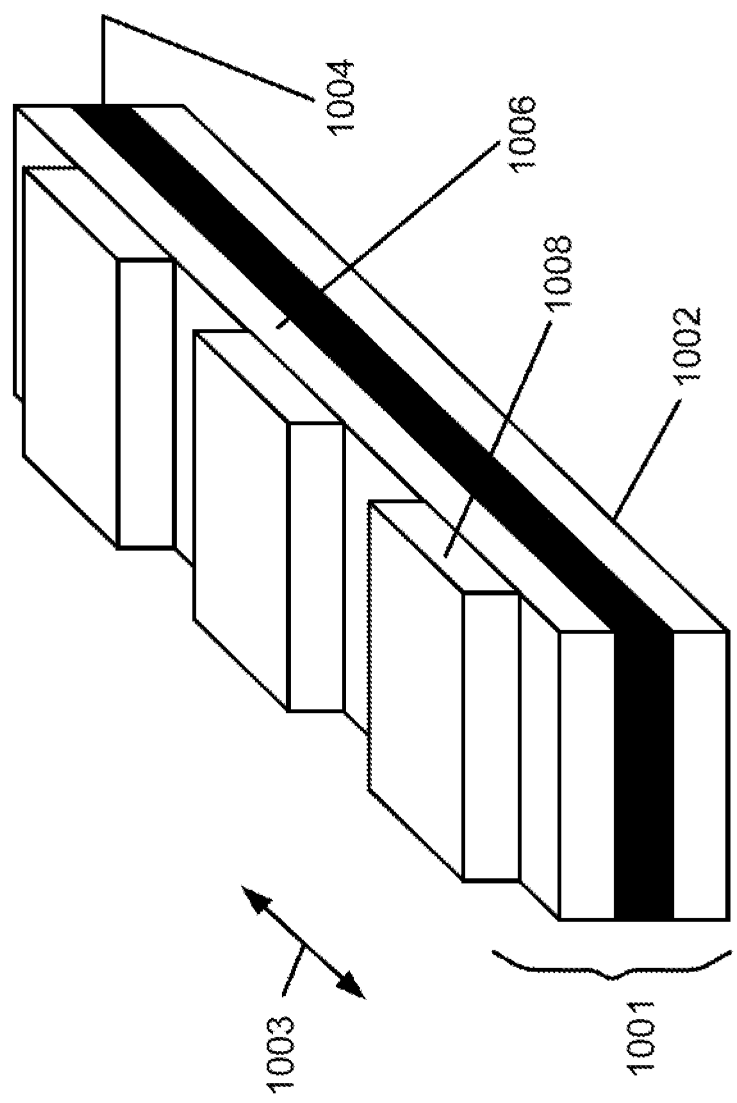
FIG. 10 is a simplified diagram illustrating a portion of a crossbar array of memory cells according to an embodiment of the present invention.

FIG. 10 is a partial crossbar array of switching device according to an embodiment of the present invention. Each of the switching devices further includes a resistive material to eliminate a current compliance. Each of the switching devices also includes a metal material interposed between the switching material and the resistive material to prevent a Schottky barrier to form between the switching material and the resistive material in a specific embodiment. As shown in FIG. 10, the device includes a first structure 1001 spatially extending in a first direction 1003. The first structure includes a first electrode 1002, a resistive material 1004, and a metal material 1006. In a specific embodiment, the first electrode can be common conductor materials used in semiconductor processing. As merely an example, the bottom electrode may be copper, tungsten, or aluminum, and others, depending on the application. The resistive material can include a semiconductor material. The resistive material may be an alloy material formed from a semiconductor and a metal material in a suitable proportion for a pre-determined resistance in a specific embodiment. In a specific embodiment, one or more switching elements 1008 are formed overlying the metal material. For example, the one or more switching element can comprise an amorphous silicon material in a specific embodiment. In other embodiment, the switching element can comprise a metal oxide material or a suitable non-conductive material. For amorphous silicon switching element, a buffer layer to provide a desirable interfacial defect level between the amorphous silicon material and the metal layer can be provided. The switching material and the buffer layer can be patterned in a single step to form the one or more switching elements in a specific embodiment. The buffer layer can be a p+ polysilicon material in a specific embodiment. Depending on the embodiment, the buffer layer may not be needed.

The crossbar array of switching devices includes a second electrode (not shown) overlying each of the one or more switching elements. The second electrode is extending in a second direction orthogonal to the first electrode to form an interconnected crossbar structure in a specific embodiment. As shown, the switching devices have a common first electrode and the resistive layer is common to the switching devices sharing the common first electrode. In this configuration, switching devices would not be simultaneously written, since any written cell will change the potential of the metal layer 1006 which can reduce actual voltage across the not yet written cells. Each of the switching devices is defined by the switching element, as shown.

Figure 11:
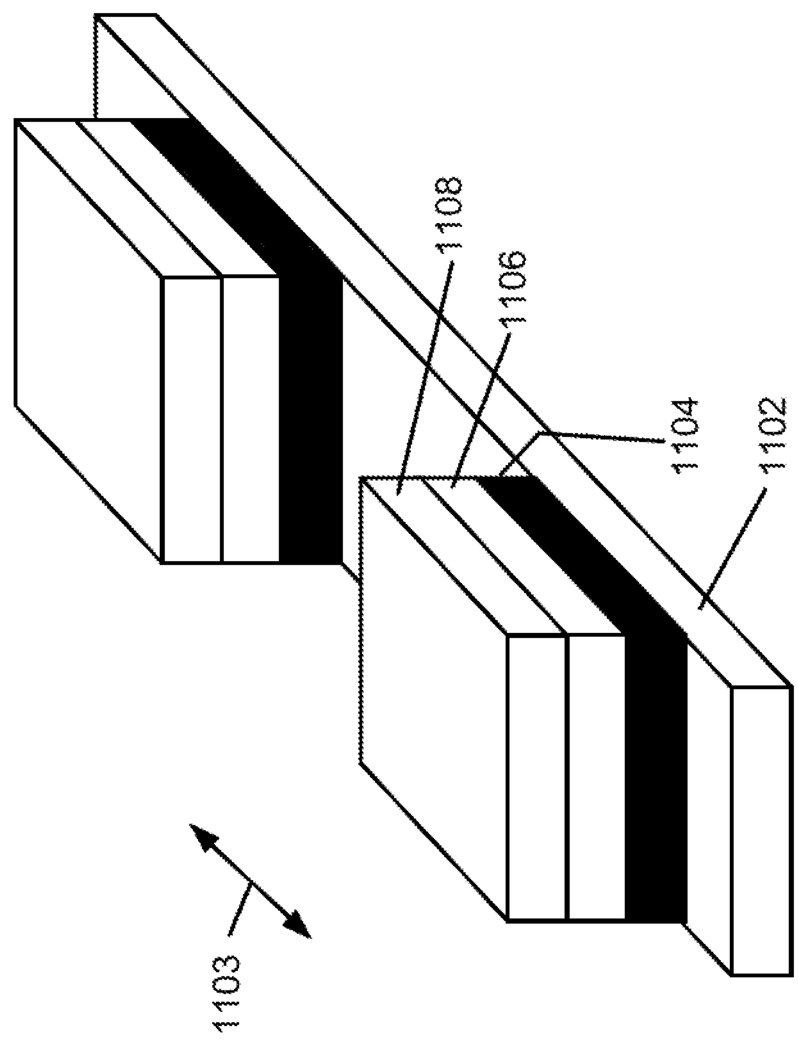
FIG. 11 is a simplified diagram illustrating a portion of a crossbar array of memory cells according to an alternative embodiment of the present invention.

FIG. 11 is a simplified diagram illustrating an alternative array of switching devices in a crossbar configuration according to an embodiment of the present invention. As shown, the device includes a first electrode 1102 extending in a first direction 1103. Each of the switching devices includes a switching material 1108 overlying a respective resistive material region 1104. A metal layer 1106 is interposed between the switching layer and the respective resistive material region to provide an ohmic contact region for the switching layer and the resistive layer in a specific embodiment. As shown, resistive material 1104 and metal material 1106 are associated with each of the switching element and not common to the switching devices formed on the first electrode. A second electrode (not shown) overlies each of the switching elements. The second electrode is arranged at an angle to the first electrode. In a specific embodiment, the first electrode is orthogonal to the second electrode. This implementation allows simultaneous programming of more than one memory cells.

In a specific embodiment, a method of forming a memory device is provided. The method includes providing a semiconductor substrate having a surface region and forming a first dielectric material overlying the surface region of the semiconductor substrate. The semiconductor substrate can be a single crystal silicon material, a silicon germanium material, or a silicon on insulator (SOI) substrate depending on the embodiment. Depending on the embodiment, the first dielectric material can be silicon oxide, silicon nitride, or a dielectric stack comprising alternating layers of silicon oxide and silicon nitride (for example an ONO stack). A first electrode material is formed overlying the first dielectric material. The first electrode material can be copper, aluminum, or tungsten, depending on the application.

In a specific embodiment, the method includes forming a resistive material overlying the first electrode material and forming a metal material overlying the resistive material. The resistive material provides for a current compliance for a switching device in the memory device in a specific embodiment. The method forms a switching material overlying metal material. The switching material is often a non-conducting material characterized by a resistance, which depends on an applied programming voltage. The first electrode material, the resistive material, the metal material, and the switching material are subjected to a first pattern and etch process to form a first structure. In a specific embodiment, the first structure is elongated in shape and spatially extending in a first direction.

The method then subjects the switching material to a second pattern and etch process to form one or more switching elements overlying the metal material and forms a second electrode structure overlying the one or more switching element. The second electrode is configured to extend in a second direction spatially perpendicular to the first electrode structure in a specific embodiment. The first electrode structure, the resistive material, the metal material, the one or more switching elements and the second electrode structure form one or more switching device as shown in FIG. 10 in a specific embodiment.

In an alternative embodiment, a method of forming a memory device is provided. The method includes providing a semiconductor substrate having a surface region and forming a first dielectric material overlying the surface region of the semiconductor substrate. The semiconductor substrate can be a single crystal silicon material, a silicon germanium material, or a silicon on insulator (SOI) substrate depending on the embodiment. Depending on the embodiment, the first dielectric material can be silicon oxide, silicon nitride, or a dielectric stack comprising alternating layers of silicon oxide and silicon nitride (for example an ONO stack). A first electrode material is formed overlying the first dielectric material. The first electrode material can be copper, aluminum, or tungsten, depending on the application.

In a specific embodiment, the method includes forming a resistive material overlying the first electrode material and forming a metal material overlying the resistive material. The resistive material provides for a current compliance for a switching device in the memory device in a specific embodiment. The method forms a switching material overlying metal material. The switching material is often a non-conducting material characterized by a resistance, which depends on an applied programming voltage.

In a specific embodiment, the method subjects the first electrode material, the resistive material, the metal material, and the switching material to a first pattern and etch process to form a first structure. The first structure is elongated in shape and extending in a first direction. The method then subjects apportion of the first structure including the resistive material, the metal material, and the switching material to a second pattern and etch process to form one or more switching elements and to form one or more resistor associated with the respective one or more switching element overlying the metal material. A second electrode structure is formed extending in a second direction spatially perpendicular to the first electrode structure overlying at least the switching element in a specific embodiment. The method forms one or more switching device as illustrated in FIG. 11 from at least the first electrode structure, the one or more switching elements, the respective resistor device associated with the one or more switching element, and the second electrode structure. The one or more resistor cause a programming current to be no greater than a predetermined value in the switching element upon application of a programming voltage to the first electrode or the second electrode in a specific embodiment.

Depending on the application, each of the switching devices can include a metal material interposed between the switching material and the resistive material. The metal material eliminates a Schottky barrier to form between the resistive material and the switching material. In a specific embodiment, the resistive material can be an insulator material formed using a co-sputtering process using the insulator material and a metal material allowing a good contact between the insulator material and the insulator material. The resistance of the resistive material can be adjusted depending on a percentage of the metal material. Alternatively, the metal material can form a concentration gradient in the insulator material to provide for a desirable contact characteristic and a desirable resistance for the resistive material. In other embodiments, the resistive material can be a semiconductor material. The semiconductor material can have a metal material characterized by a concentration or a concentration gradient in the semiconductor material, or a combination to provide for a desirable resistance for the semiconductor material in a specific embodiment. The semiconductor material may also be doped using one or more suitable impurity though doping usually occurs at a high temperature (greater than about 600 Degree Celsius) and may not be a preferred method. Of course one skilled in the art would recognize other modifications, variations, and alternatives.

Though the present invention has been described substantially using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims

What is claimed is:

1. A method of forming a memory device, comprising:

providing a semiconductor substrate having a surface region;

forming a first dielectric material overlying the surface region of the semiconductor substrate;

forming a first electrode material layer overlying the first dielectric material;

forming a resistive material layer overlying the first electrode material;

forming a metal material layer overlying the resistive material;

forming a resistive switching material layer overlying the metal material layer, wherein such resistive switching material layer comprises an amorphous silicon material;

forming an interface layer between and in ohmic contact with both the metal material layer and the resistive switching material layer, wherein such interface layer comprises conductive polycrystalline silicon;

subjecting the layers of the first electrode material, the resistive material, the metal material, the interface and the resistive switching material to a first pattern and etch process to form a first structure and a first electrode structure, the first structure and the first electrode structure being elongated in shape and extending in a first direction;

subjecting the first structure to a second pattern and etch process to form a second structure comprising one or more switching elements and one or more resistors associated with the one or more switching elements, respectively;

forming a second electrode structure extending in a second direction spatially perpendicular to the first electrode structure, overlying and in ohmic contact with at least the second structure; and forming one or more switching devices from at least the first electrode structure, the one or more switching elements, the one or more resistors associated with the one or more switching elements, respectively, and the second electrode structure, wherein a resistor from the one or more resistors limits a programming current in a respective switching element from the one or more switching elements to be no greater than a predetermined current upon application of a programming voltage to an electrode from the second electrode structure that is coupled to the respective switching element, and wherein the resistor is characterized by a resistance substantially similar to the on state resistance of the respective switching element, such that an erase voltage of the switching element is increased to about a write voltage of the switching element.

2. The method of claim 1 wherein the resistor forms a series resistor coupled to the respective switching element.

3. The method of claim 2 wherein the series resistor causes a current compliance for the respective switching device.

4. The method of claim 1 wherein the respective switching element is characterized by an on state resistance and an off state resistance.

5. The method of claim 4 wherein the respective switching element comprises a plurality of metal particles derived from the second electrode from the second electrode structure.

6. The method of claim 5 wherein the second electrode structure comprises a metal selected from a group consisting of: silver, platinum, palladium, gold, and nickel.

7. The method of claim 5 wherein the plurality of metal particles derived from the electrode forms a filament structure within the respective switching element;

wherein a first length for the filament structure is associated with the on state resistance; and wherein a second length for the filament structure is associated with the off state resistance.

8. The method of claim 5 wherein the resistive switching material is initially formed substantially free from the plurality of metal particles.

9. The method of claim 1 wherein the conductive polycrystalline silicon containing layer comprises a p-doped polysilicon material.

10. A method for forming a plurality of memory devices comprising:

forming a first electrode material overlying the first dielectric material;

forming a resistive material overlying the first electrode material;

forming a metal material overlying the resistive material;

forming a resistive switching material overlying the metal material comprising an amorphous silicon material layer;

forming a metal material to resistive switching material interface layer between and in ohmic contact with the metal material, the amorphous silicon material layer comprising conductive polycrystalline silicon;

subjecting the resistive material, the metal material, the metal material to resistive switching material interface layer and the resistive switching material to a first pattern and etch process to form a first structure, and subjecting the first electrode material to the first pattern and etch process to form a first electrode structure, wherein the first electrode structure is elongated in shape and extends in a first direction;

subjecting the first structure to a second pattern and etch process to form a second structure comprising a plurality of switching elements and a respective plurality of resistors associated with the plurality of switching;

forming a second electrode structure extending in a second direction spatially perpendicular to the first direction, overlying and in ohmic contact with the second structure; and wherein a plurality of memory devices are formed from the first electrode structure, the plurality of switching elements, the respective plurality of resistors, and the second electrode structure; and wherein the respective plurality of resistors are configured to limit programming current in the plurality of switching elements to be no greater than programming currents associated with the plurality of switching elements, wherein the plurality of switching elements are characterized by an on state resistance and an off state resistance, wherein the plurality of resistors are characterized by resistances substantially similar to the on state resistance, such that an erase voltage of the plurality of switching elements is increased to about a write voltage of the plurality of switching elements.

11. The method of claim 10 wherein the respective plurality of resistors are coupled in series to the plurality of switching elements.

12. The method of claim 11 wherein the respective plurality of resistors causes a current compliance in the plurality of switching devices.

13. The method of claim 10 wherein the plurality of switching elements comprises a plurality of metal particles derived from the second electrode structure.

14. The method of claim 13 wherein the second electrode structure comprises a metal selected from a group consisting of: silver, platinum, palladium, gold, and nickel.

15. The method of claim 13 wherein the respective plurality of metal particles that are derived from the second electrode structure form filament structures within the plurality of switching elements;

wherein first lengths for the filament structures are associated with the on state resistance;

wherein second lengths for the filament structures are associated with the off state resistance; and wherein the first lengths exceed the second lengths.

16. The method of claim 13 wherein the resistive switching material is initially formed substantially free from the plurality of metal particles.

17. The method of claim 10 wherein the conductive polycrystalline silicon containing layer comprises a p-doped polysilicon material.

* * * * *